(12) United States Patent
Smith et al.

(10) Patent No.: US 6,990,385 B1
(45) Date of Patent: Jan. 24, 2006

(54) DEFECT DETECTION USING MULTIPLE SENSORS AND PARALLEL PROCESSING

(75) Inventors: James A. Smith, Los Altos, CA (US); Erik Johnson, Santa Clara, CA (US)

(73) Assignee: KLA-Tencor Technologies Corporation, Milpitas, CA (US)

(*) Notice: Subject to any disclaimer, the term of this patent is extended or adjusted under 35 U.S.C. 154(b) by 0 days.

(21) Appl. No.: 10/765,515

(22) Filed: Jan. 26, 2004

Related U.S. Application Data

(60) Provisional application No. 60/444,754, filed on Feb. 3, 2003.

(51) Int. Cl.
  G06F 19/00 (2006.01)
  G06F 15/16 (2006.01)
  G05B 11/01 (2006.01)
  G01R 31/26 (2006.01)

(52) U.S. Cl. .................. 700/110; 700/19; 700/121; 438/14; 709/200

(58) Field of Classification Search ............... 700/1–4, 700/19, 20, 51, 59, 90, 95, 96, 108, 109, 700/110, 117, 112, 121; 438/5–18; 709/200
See application file for complete search history.

(56) References Cited

U.S. PATENT DOCUMENTS

| | | | |
|---|---|---|---|
| 4,644,461 A * | 2/1987 | Jennings ..................... 718/106 |
| 5,699,447 A * | 12/1997 | Alumot et al. .............. 382/145 |
| 5,737,072 A | 4/1998 | Emery et al. | |
| 5,761,064 A * | 6/1998 | La et al. ..................... 700/110 |
| 5,933,351 A * | 8/1999 | Balamurugan .............. 700/121 |
| 5,991,699 A * | 11/1999 | Kulkarni et al. ............. 702/83 |
| 6,130,967 A * | 10/2000 | Lee et al. ................... 382/302 |
| 6,370,487 B1 * | 4/2002 | Dorough .................... 702/188 |
| 6,415,188 B1 * | 7/2002 | Fernandez et al. ........... 700/67 |
| 6,529,621 B1 | 3/2003 | Glasser et al. | |
| 6,614,520 B1 | 9/2003 | Bareket et al. | |
| 6,701,259 B2 * | 3/2004 | Dor et al. ..................... 702/35 |
| 6,721,939 B2 * | 4/2004 | Wang et al. ................. 716/21 |

FOREIGN PATENT DOCUMENTS

WO  WO00/68673  11/2000

OTHER PUBLICATIONS

Derfler, "How Networks Work" Sep. 2000, Greg Wiegand, Millennium Edition, pp. 55, 91-93, 109, 147, 150-151.*

* cited by examiner

*Primary Examiner*—Leo Picard
*Assistant Examiner*—Sean Shechtman
(74) *Attorney, Agent, or Firm*—Beyer Weaver & Thomas, LLP

(57) ABSTRACT

Techniques for detecting defects on semiconductor wafers are described. The techniques involve a parallel processing system wherein a data distribution system contains data distribution nodes that are interconnected by multiple data transfer paths. This configuration allows data collected by any of the detectors to be routed to any one of a plurality of processing nodes. This in turn allows a variety of defect analysis algorithms to be implemented.

20 Claims, 9 Drawing Sheets

Specimen

DEFECT DETECTION USING MULTIPLE SENSORS AND PARALLEL PROCESSING

CROSS-REFERENCE TO RELATED APPLICATIONS

This application claims priority of U.S. provisional patent application No. 60/444,754, filed Feb. 3, 2003, entitled "DEFECT DETECTION USING MULTIPLE SENSORS AND PARALLEL PROCESSING," which is hereby incorporated by reference.

This application is related to U.S. patent application No. 60/132,872, filed May 5, 1999, entitled "Method and Apparatus for Inspecting Reticles Implementing Parallel Processing", the content of which is hereby incorporated by reference.

FIELD OF THE INVENTION

The present invention relates generally to semiconductor wafer inspection, and more specifically to parallel processing techniques for semiconductor wafer inspection.

BACKGROUND OF THE INVENTION

Generally, the industry of semiconductor manufacturing involves highly complex techniques for integrating circuits into semiconductor materials. Due to the large number of processing steps and the decreasing size of semiconductor devices, the semiconductor manufacturing process is prone to processing defects that decrease device yields. Testing procedures to eliminate these processing defects from the processing steps are therefore critical for maintaining high yielding production facilities.

Semiconductor defect detection systems use techniques ranging from optical, electron emission, reflectivity measurements to x-ray detection. For instance, a scanning electron microscope can be use to direct an electron beam at a semiconductor wafer so that backscattered and/or secondary electron emissions can be measured. One conventional defect detection process operates by comparing individual semiconductor device areas formed upon a semiconductor wafer. Since many, if not all, of the device areas are identical to each other, any differences detected between any two of the device areas can be a defect. Various computerized systems and algorithms are used to analyze data collected from similar device areas in order to determine the presence of such defects. Since the testing procedures are an integral and significant part of the manufacturing process, more sensitive and efficient testing procedures would be desirable.

BRIEF SUMMARY OF THE INVENTION

The present invention is directed to techniques for detecting defects on semiconductor wafers in which sets of parallel processing nodes process data collected from respective sensor/detectors positioned about the semiconductor wafer. The techniques involve a parallel processing system wherein a data distribution system contains data distribution nodes that are interconnected by multiple data transfer paths. This configuration allows data collected by any of the detectors to be routed to any one of a plurality of processing nodes. This in turn allows a variety of defect analysis algorithms to be implemented.

As a method, one implementation of the present invention involves collecting data with a plurality of detectors that are positioned about the semiconductor wafer, transmitting the data frames from each detector to a data distribution node, transferring a first data frame along a first data transfer path that connects a first and a second data distribution node, transferring a second data frame along a second data transfer path that connects the first and second data distribution nodes, routing the data frames from the data distribution nodes to processing nodes, wherein the transferring of data frames between data distribution nodes allows data from any one of the detectors to be routed to any one of the processing nodes, and processing the data frames within each of the processing nodes.

In another implementation of the method, the processing of data further comprises a composite-row based analysis that involves generating a first composite image that is made up of each of the data frames collected by one of the detectors, wherein the first composite image is a composite of the images corresponding to each of the device areas, generating a first composite image corresponding to the data frames collected by each of the detectors, and comparing each of the first composite images in order to obtain defect information.

In another implementation of the method, the processing of data further comprises a composite-column based analysis that involves, for each die, generating a second composite image by combining the data frames collected by each detector corresponding to a specific die, and comparing each of the second composite images in order to obtain defect information.

In yet another implementation of the method, the processing of data further comprises a row based analysis involving, for each detector, comparing the data frames collected for each of the plurality of device areas, wherein there are four or more device areas.

And in yet another implementation of the method, the processing of data further comprises a column based analysis involving, for each die, comparing the data frames collected by each detector.

Another aspect of the invention pertains to an inspection system that is configured to implement the method as described above.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, can best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention can be practiced without some or all of these specific details. In other instances, well known operations have not been described in detail so not to unnecessarily obscure the present invention.

Figure 1:
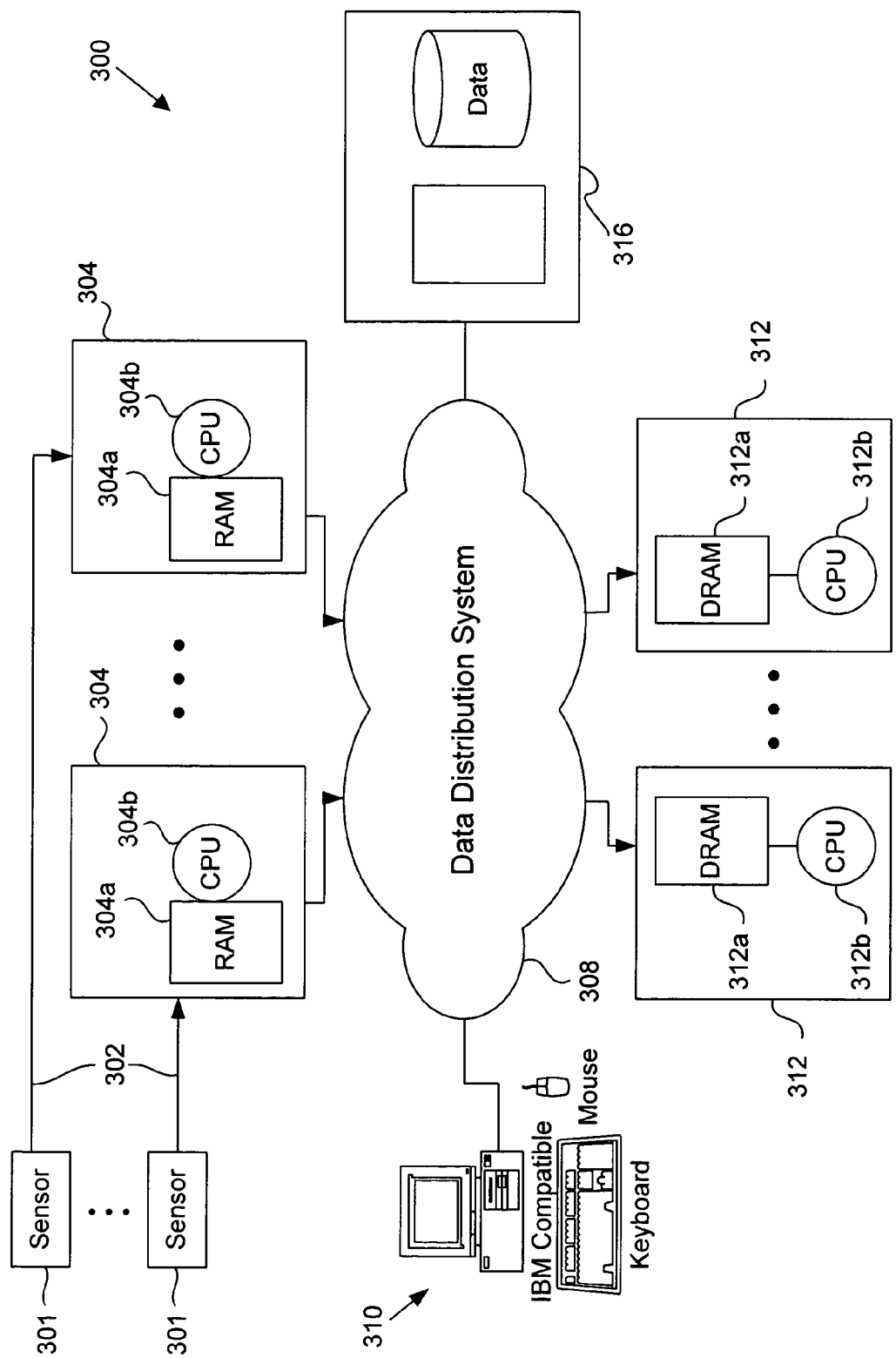
FIG. 1 is a diagrammatic representation of an inspection system in accordance with one embodiment of the present invention.

FIG. 1 is a diagrammatic representation of an inspection system 300 in accordance with one embodiment of the present invention. The inspection system includes input data 302 from a set of sensors 301, optional memory devices 304, a data distribution system 308, a group of processing nodes 312, an optional mass storage device 316, and a system control processor 310. A processing node typically can include one or more microprocessor integrated circuits, interface and/or memory integrated circuits, and can additionally be coupled to one or more shared global memory devices. Processing nodes 312 are also referred to as "leaf processors."

Data distribution system 308 is arranged to receive input 302 from sensors 301. Sensors 301 can be an optical detector, an electron detector, a scanner, or any suitable instrument for receiving signals in order to create an image of a sample. For example, the sensor can receive signals from an inspected specimen based on a portion of light that is reflected, transmitted, or otherwise directed from the specimen. The sensors can be positioned within an inspection system such as a scanning electron microscope (SEM) or an optical inspection device. Multiple sensors 301 are positioned about a single sample to be inspected in order to obtain a larger data set for analyzing the sample. Some implementations of the invention can use two or more sensors depending upon the amount of data required. Data distribution system 308 is designed so that data from any one of sensors 301 can be transmitted to any one of processing nodes 312. As will be shown later, this flexibility allows system 300 to analyze data collected from a sample using a large number of algorithms.

The image data can be obtained from any suitable sample type. For example, the sample can be a reticle having a multitude of fine patterns thereon. By way of another example, the sample can be a semiconductor device, material, or wafer, a backside pellicle, or a computer disk.

Image data 302 can take any suitable form for representing an image of the sample. For example, the image data typically includes a plurality of images or image portions that each represents a portion or patch of the sample. The portions of the sample are scanned to create image data. These sample portions and corresponding images can be any size and shape depending on the particular system and application requirements. The images can be obtained by scanning the sample in any suitable manner. By way of example, the images can be obtained by raster scanning the sample. Alternatively, the images can be obtained by scanning the sample with any suitable pattern, such as a circular or spiral pattern. Of course, the sensors have to be arranged differently (e.g., in a circular pattern) and/or the sample can be moved differently (e.g., rotated) during scanning in order to scan a circular or spiral shape from the sample.

In the embodiment illustrated below, as the sample moves past sensors 301, a rectangular region (herein referred to as a "strip") of the sample is converted into a set of images. In this embodiment, the sensors are arranged in a rectangular pattern. For this example, the sensors are arranged to receive light from the sample and generate therefrom a set of data that corresponds to a strip of the sample, which is about 1 million pixels wide and about 1000 to 2000 pixels high.

In an alternative embodiment, known as "double darkfield," a light source is directed onto the sample at a low incidence angle. In other words, the angle between the incoming light source and the surface of the sample is relatively small. Then several sensors are positioned above the sample at various angles relative to the projected angle of illumination. Specifically, two sensors are placed above and at opposite edges of the sample and the third sensor is placed above the sample.

Figure 2:
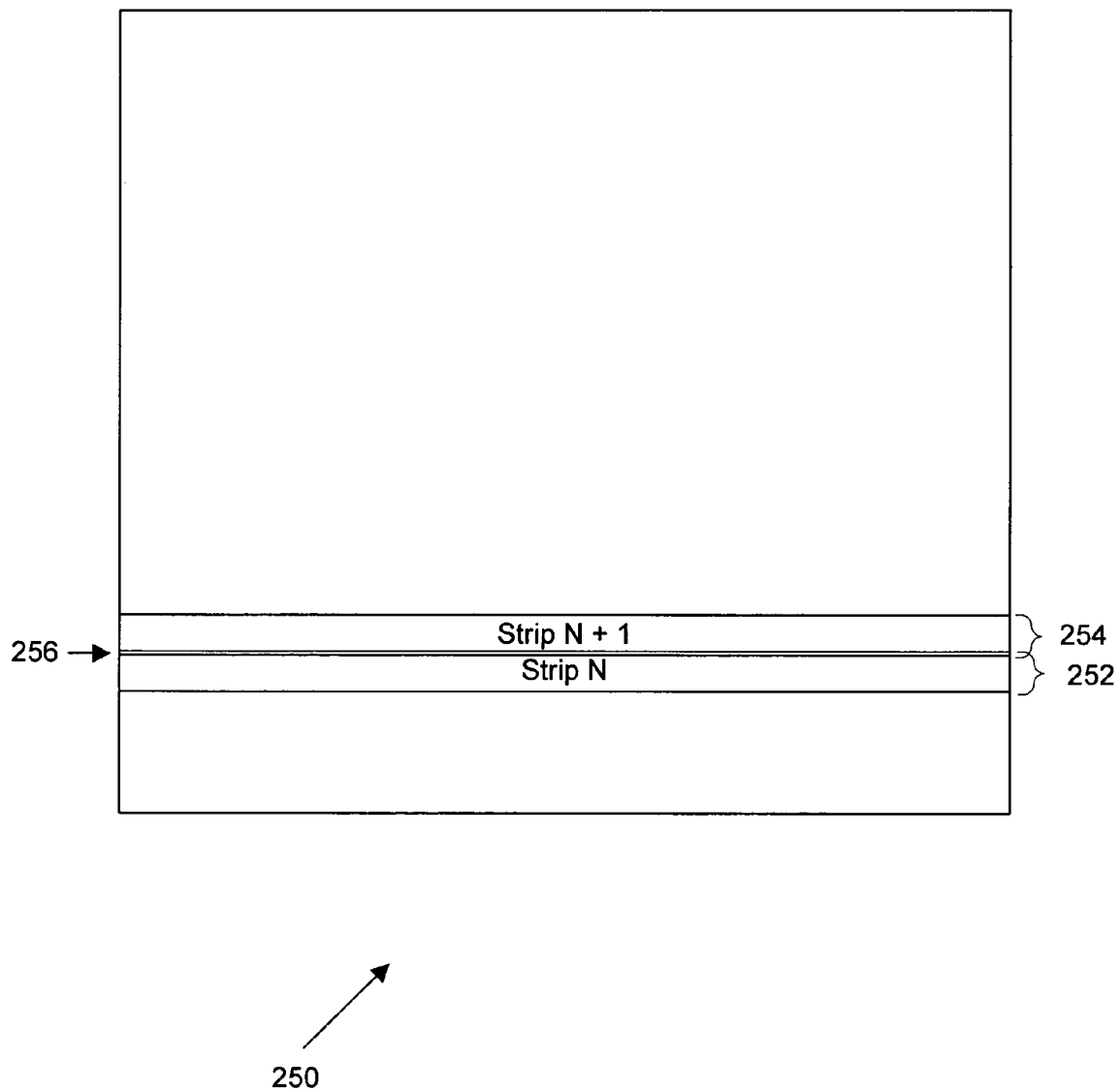
FIG. 2 is a diagrammatic representation of two sets of image data corresponding to two "strips" of a sample in accordance with embodiment of the present invention.

FIG. 2 is a diagrammatic representation of two sets of image data corresponding to two "strips" 252 and 254 of a sample 250, such as a reticle or a semiconductor wafer, in accordance with embodiment of the present invention. In the example of FIG. 2, a first set of image data corresponds to a first strip 252 of the sample 250 and a second set of image data corresponds to a second strip 254 of the sample 250.

Each set of image data can be obtained by sequentially scanning strips from the sample in a serpentine or raster pattern. For example, the first strip 252 of the sample 250 is scanned by an image acquisition system from left to right to obtain a first set of image data. The second strip 254 is then scanned from right to left to obtain a second set of image data.

In a preferred embodiment, there is an overlap 256 between each set of image data and the next set of image data that corresponds to an overlap on the sample. This overlap allows more flexibility in processing certain patterns on the sample 250. For example, this overlap ensures that any pattern anywhere on the part of the surface covered by overlapping strips will be fully contained within at least one strip, as long as the height of the pattern is less than or equal to the height of the overlap area. Most algorithms cannot properly detect a defect in a pattern unless the whole pattern is present in the image portion that the algorithm is examining.

Turning back to FIG. 1, the image data 302 is received by data distribution system 308. Data distribution system 308 can be associated with one or more memory devices 304. Memory devices 304 include RAM buffers 304a and optionally also include CPU's 304b. RAM buffers 304a hold at least a portion of the received image data 302 from each sensor 301. Buffers 304a are logically separate from each other. In one embodiment, each memory device 304 is associated with a respective sensor 301. Preferably, the total memory is large enough to hold an entire strip of image data. For example, one gigabyte of memory works well for a strip that is 1 million by 1000 pixels. In alternative embodiments, there are more than two memory devices 304.

Data distribution system 308 controls distribution of portions of the received image input data 302 to the processing nodes 312. For example, data distribution system 308 can route a first image or set of images to one of processing nodes 312, and can route a second image or set of images to a second one of processing nodes 312. Data distribution system 308 is designed so that data 302 from any one of sensors 301 can be distributed to any one of processing nodes 312. This flexibility in data distribution allows system 300 to perform a variety of data analysis algorithms that provide greater defect detection capabilities. Processing nodes 312 can receive an image that corresponds to at least a portion or patch of the sample.

Processing nodes 312 include CPU's 312b for processing data and each CPU can be coupled to or integrated with one or more memory devices 312a, such as DRAM devices, that provide local memory functions such as holding the image data portion. Preferably, the memory is large enough to hold an image that corresponds to a patch of the sample. For example, eight megabytes of memory works well for an image corresponding to a patch that is 512 by 1024 pixels. Alternatively, the processing nodes can share memory. Processing nodes 312 also include I/O interfaces to facilitate the connection between each processing node 312 with data distribution system 308. There can be three or more processing nodes used in a single system 300 depending upon the processing power that is required.

Each set of image data 302 can correspond to a strip of the sample. One or more sets of image data can be stored in memory of the data distribution system 308. One or more processors within the data distribution system 308 can control this memory and the memory can be divided into a plurality of partitions. For example, the data distribution system 308 can receive an image corresponding to a portion of a strip into a first memory partition (not shown), and the data distribution system 308 can receive another image corresponding to another strip into a second memory partition (not shown). Preferably, each of the memory partitions of the data distribution system 308 only holds the portions of the image data that are to be routed to a processor associated with such memory partition. For example, the first memory partition of the data distribution system 308 can hold and route a first image to one of processors 312, and the second memory partition can hold and route a second image to a second one of processors 312. See FIG. 6 below.

The data distribution system 308 can also divide and route portions of the received image data to processors. The image data can be divided by the data distribution system 308 in any suitable manner for facilitating data analysis. For example, the image data can be divided into images that each correspond to a "patch" of the sample.

Figure 3:
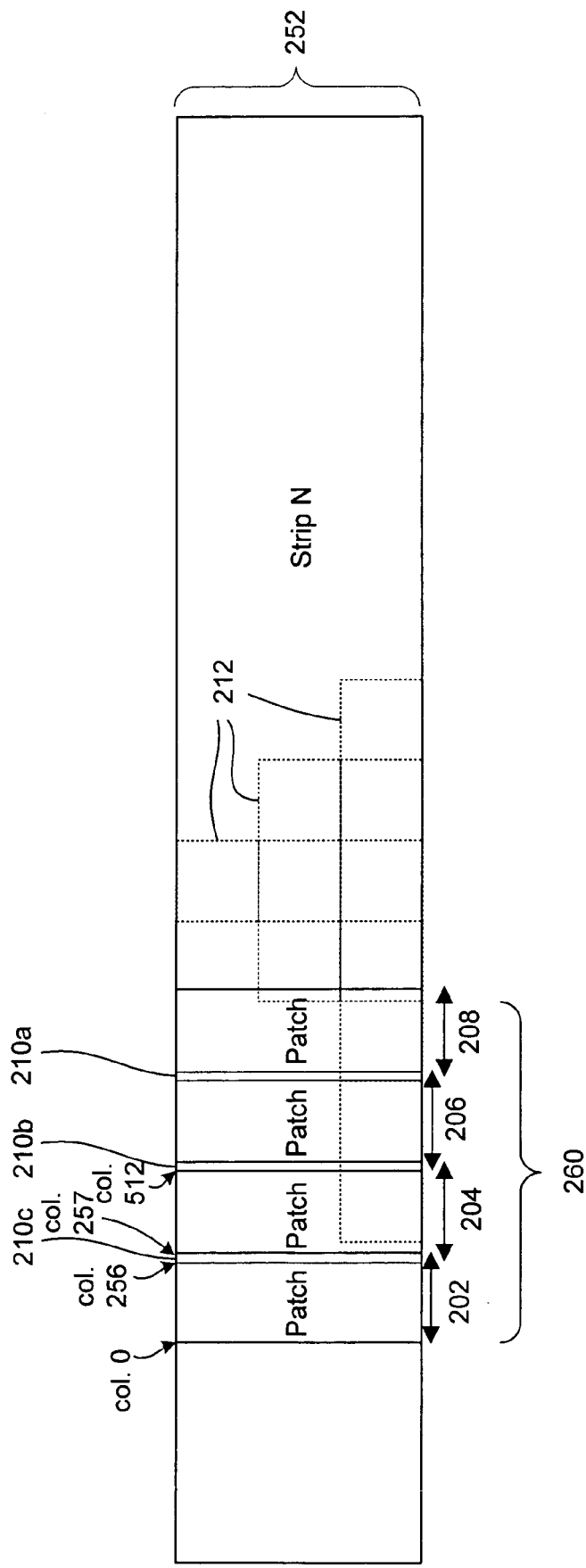
FIG. 3 is a diagrammatic illustration of an image data set that corresponds to a strip that is divided into patches in accordance with one embodiment of the present invention.

FIG. 3 is a diagrammatic illustration of an image data set 260 that corresponds to strip 252 of FIG. 2. Image data set 260 is divided into patches in accordance with one embodiment of the present invention. As shown, the image set includes a plurality of images or patches 202, 204, 206, and 208. Dashed boxes represent semiconductor device areas 212 that are formed on specimen 250. Typically, the majority of a wafer is formed to have a matrix of semiconductor device areas 212. Each of such device areas is eventually cut out of the semiconductor wafer to form individual semiconductor die. Note that for the sake of clarity, not all of the device areas 212 are represented in FIG. 3. Also note that a single device area 212 can be located within one or more patches depending upon the width of the patches and the device areas 212.

Like the sets of image data corresponding to overlapping strips, the images within a particular set of image data can also overlap. As shown, there is an overlap area 210c between images 202 and 204, an overlap area 210b between images 204 and 206, and an overlap area 210a between images 206 and 208.

As discussed above for the overlapping strip images of FIG. 2, overlapping of patch images also facilitates reliable processing. For example, the overlapping areas make it possible to process a complete structure that lies partly or completely within the overlap area when the width of the structure is less than the overlap width. The erosion or loss of data that occurs at the edges of patches when using convolutions and other local-neighborhood operations can also be eliminated when there is an overlap.

Additionally, the overlap areas can allow for independent functioning of the processors. In other words, each processing node can independently analyze an image without having to share information with another processing node. The overlap areas can eliminate the need for processing nodes to communicate with each other, which results in a simpler architecture. For example, the memory partition containing the image data can be read-only accessible by the processing node, and thus, mechanisms for ensuring cache coherency are not required.

The data distribution system 308 can define and distribute each image of the image data based on any suitable parameters of the image data. For example, the images can be defined and distributed based on the corresponding position of the patch on the sample. In one embodiment, each strip is associated with a range of column positions that correspond to horizontal positions of pixels within the strip. For example, columns 0 through 256 of the strip can correspond to a first patch, and the pixels within these columns will form the first image, which is routed to one or more processing nodes. Likewise, columns 257 through 512 of the strip can correspond to a second patch, and the pixels in these columns will form the second image, which is routed to different processing node(s).

In sum, the present invention provides mechanisms for dividing the image data into manageable chunks or image portions that can be readily analyzed in parallel by individual processing nodes. Thus, the entire image data can be parsed into a number of images, and one or more image(s) can be distributed to each separate processing node. The processing nodes can then independently and efficiently analyze the received images(s) in parallel.

After one of the processing nodes receives an image, it is analyzed in any suitable manner so as to derive information about the received image input 302. In one embodiment, the processor can also receive reference data from database 316, in addition to the image. This reference data can be in any suitable form that facilitates characterization of the image input data 302. For example, the reference data can be generated from a provided circuit pattern design database (e.g., that resides in mass storage 316). The reference data can be received as a grayscale pixel-mapped reference image, or it can be received as a specification of a set of shapes and their locations that together define the reference pattern. In the latter case, the processing node converts the reference data to a grayscale pixel-mapped reference image before comparing the reference information with the image portion.

The processing node can process the reference data in any suitable manner, such as by directly converting the contents of the circuit pattern database into a reference image. The reference data portion (e.g., from the circuit pattern database) can be converted or rendered into a reference image portion by the processing nodes in a way that takes into account the effects of fabrication and image acquisition processes. For example, the corners of a circuit pattern in the reference data can be rounded during conversion to simulate the corner rounding that commonly occurs during fabrication of a reticle. The rendered reference image can also be adjusted to simulate expected optical effects of the optical image acquisition system. Such optical effects are necessarily encountered when an optical inspection technique is used to evaluate a reticle.

Thus, the reference image can represent what the image of the patch should look like without any defects. By way of specific example, processing node 312 can be configured to receive a first image of the image data 302 and corresponding reference data. Additionally, processing node 312 can generate the corresponding reference image from the reference data. The processing node 312 can then compare the first image to the corresponding reference image. If processing node 312 determines that there are relatively large differences, in degree and/or kind, between the image and reference image, the processing node 312 can define, report, and/or flag one or more defects for the patch corresponding to the image.

Alternatively, the reference data can be an image corresponding to a patch of the sample that is within a die adjacent to the die of the patch under test. This is commonly referred to as a die-to-die analysis. In other words, images corresponding to two adjacent die patches are analyzed in conjunction by a processing node. The present invention can also be implemented for cell-to-cell comparisons. By way of another example, an image that is generated with light reflected off the sample can be compared with an image that is generated with light transmitted through the sample. Several embodiments of this technique are described in U.S. patent application filed on 7 Apr. 1998 having issue number 5,737,072, entitled "Automated Photomask Inspection Apparatus and Method" by Emery et al., which is herein incorporated by reference in its entirety. By way of a final example, the reference data can be in the form of previously obtained image data before any defects were present on the sample. Several embodiments are described in U.S. patent application filed on 18 Dec. 1997, having application Ser. No. 08/993,107, entitled "Method for Inspecting a Reticle" by Bareket et al., which is herein incorporated by reference in its entirety.

Any suitable algorithms can be implemented for analysis of an image. For example, an algorithm can simply compare line widths between the image and reference data. If the difference between the width of a line in the image and a width of a line in the reference image is more than a predetermined amount, the processing node can flag a defect. The same algorithm can be used by two different processing nodes, but under varying conditions. For example, the predetermined amount can be less stringent for one processing node and more stringent for the other processing node. In sum, the algorithms used by the individual processing nodes can vary qualitatively and/or quantitatively. Several embodiments for various algorithms and inspection analysis techniques are described in U.S. patent application filed on 17 Dec. 1998 having application Ser. No. 09/213,744, entitled "Mechanisms for Making and Inspecting Reticles" by Glasser et al., which is herein incorporated by reference in its entirety.

Another example algorithm is one that flags a defect if the difference between the image intensity and the reference intensity at the defect location exceeds some predetermined threshold. This threshold can be varied based upon the image location and the sensor image, and can be supplied to each processing node.

Another example algorithm is one that flags a defect if a signal from the defect is sufficiently above that of the background noise. The criterion for sufficiency can be predetermined and supplied to each processing node. In addition, the background noise can be automatically and adaptively estimated using the images supplied to the processing nodes. The use of images from multiple dies and multiple sensors can significantly improve the estimate of the noise statistics, thereby achieving very high defect detectability and very low numbers of false positives.

As shown in FIG. 1, the inspection system 300 also includes central processor 310 for providing a user interface and controlling the various components of the inspection system 300. The central processor 310 can take any suitable form for interfacing with and controlling the inspection system components. The central processor 310 can be in the form of an IBM compatible computer, for example, that communicates with the components that are coupled with the data distribution system 308. The central processor 310 can be used to configure the data distribution system 308 to divide, store and/or distribute particular portions of the image input 302 to particular processors 312. For example, data distribution system 308 can be configured to distribute a first portion of the image data 302 to one of processors 312. Similarly, data distribution system 308 can be configured to distribute a second portion of the image data 302 to a second one of processors 312.

Central computer 310 can also be utilized to configure how processors analyze the received portions of the image data 302. For example, each processor can be configured to implement a different algorithm for processing its received portion of image data 302. By way of another example, each processor can use the same algorithm, but be configured to implement the algorithm under different conditions.

Although the processors of the present invention are described as being configurable by a central processor or computer, of course, the processors can contain hard-coded instructions. However, when the processors are configurable, the present invention provides a flexible and efficient system for inspecting samples. That is, algorithms can be carefully tailored and changed on the fly for different sample types, different patches on the sample, and different application requirements.

FIG. 1 is a conceptual representation of the present invention. Thus, some components that can be implemented within the inspection system 300 have been excluded from the illustration so as to not obscure the invention. Additionally, the particular arrangement of the various components of the inspection system 300 is merely illustrative and not intended to limit the scope of the present invention.

Figure 4:
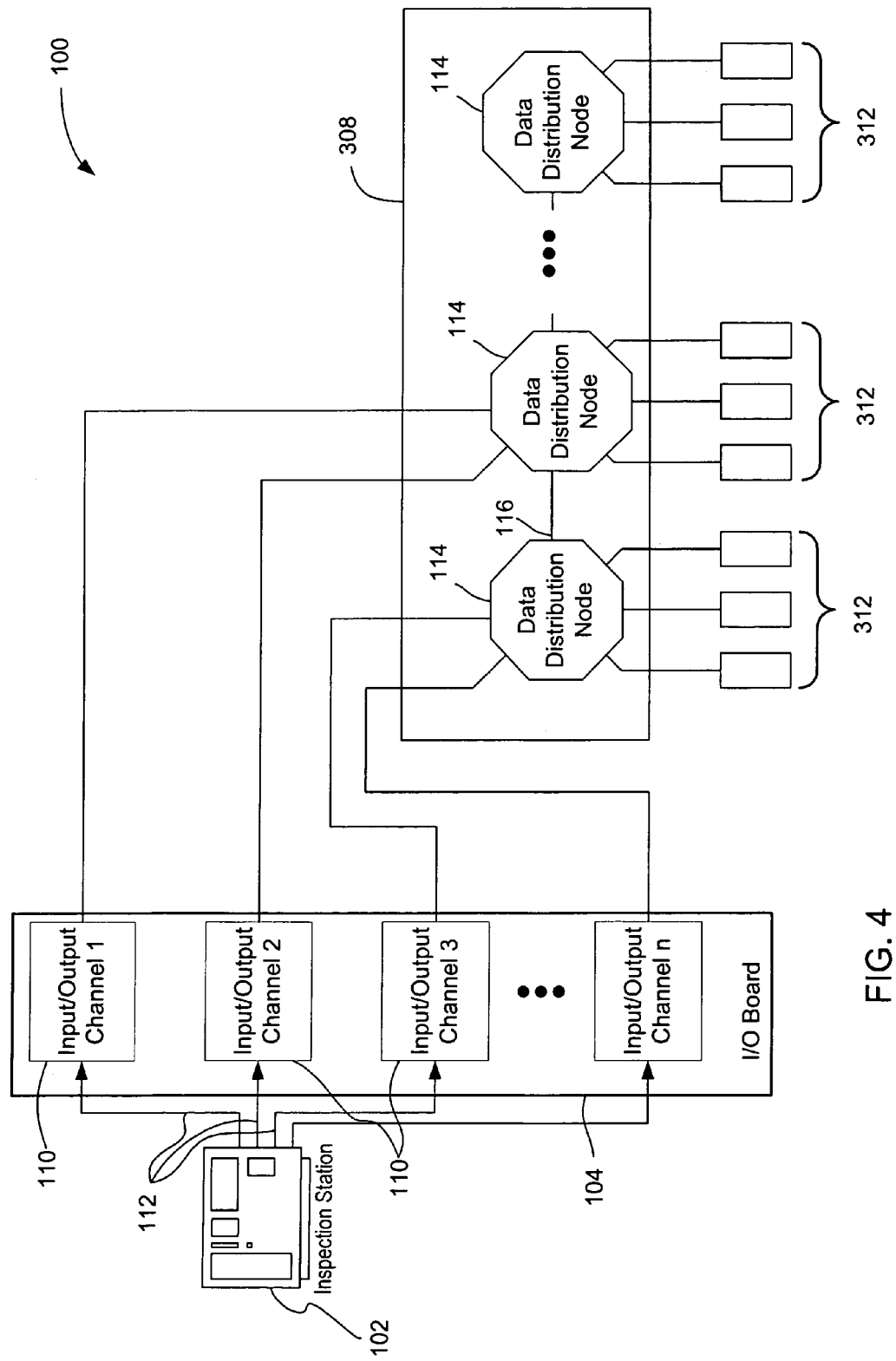
FIG. 4 illustrates a high-level hardware representation of the system in accordance with one embodiment of the present invention.

FIG. 4 illustrates a high-level hardware representation of the system 100 in accordance with one embodiment of the present invention. Inspection system 100 includes an inspection station 102, an input/output (I/O) board 104, a data distribution system 308, and a set of processing nodes (or leaf processors) 312. Inspection station 102 is linked to multiple I/O channels 110 within I/O subsystem 104 so that data 112 from inspection station 102 can be sent through each of I/O channels 110. I/O channels 110 are linked to a set of processing nodes 312 through data distribution system 308 so that data sent through I/O channels 110 can be processed by processing nodes 312.

Inspection station 102 is a device that is capable of inspecting a semiconductor wafer and collecting data about the wafer. Inspection station 102 has multiple detectors set about the wafer to collect data. For instance, inspection station 102 is a scanning electron microscope having detectors capable of detecting backscatter and/or secondary electrons that emanate from the wafer. In alternative embodiments, inspection station 102 can use optical, x-ray, reflectivity or other techniques for inspecting the wafer. Each of the detectors (not shown) within inspection station 102 collects its own set of data and then sends its set of data to one of I/O channels 110.

I/O subsystem 104 has one or more electronic substrates (or boards) having multiple I/O channels 104. FIG. 4 shows I/O channels 1, 2, 3, . . . n. In some embodiments, each detector in inspection station 102 sends collected data to more than one I/O channel. The number of I/O channels to which data is sent from a detector depends on various factors, one of which being the amount of data collected by a detector. Each detector in inspection station 102 can send data to a different number of I/O channels 110.

Data distribution system 308 includes multiple data distribution nodes 114. Data distribution nodes 114 receive data from one or more input/output (I/O) channels 110 and then reroute the data to selected ones of processing nodes 312. Data distribution nodes 114 are also connected to each other with "crossbar connections" 116 so that data can be transferred between each of the data distribution nodes 114. Crossbar connections 116 allow for data transmitted to one of data distribution nodes 114 to be routed to any of processing nodes 312 even if the specific processing node is not directly connected to the data distribution node. For example, data is transmitted from one data distribution node 114 to another through a crossbar connection 116, then the data is routed to the appropriate processing node 312.

Each data distribution node 114 is connected to a set of processing nodes 312. Processing nodes 312 are arranged to process the data from I/O channels in parallel. Each processing node 312 includes memory devices and a processing unit. Memory units can include strip storage and/or buffer memory. Each processing node 312 is logically similar to the next processing node 312 and therefore is equally capable of executing any of the processing tasks required of the defect detection process. This capability also eases the task of distributing data among processing nodes 312 because distinctions between each of the processing nodes are not required. Since processing nodes 312 are similar, it also is a relatively easy task to add additional processing nodes 312 to inspection system 100 in order to increase the processing power.

Figure 5:
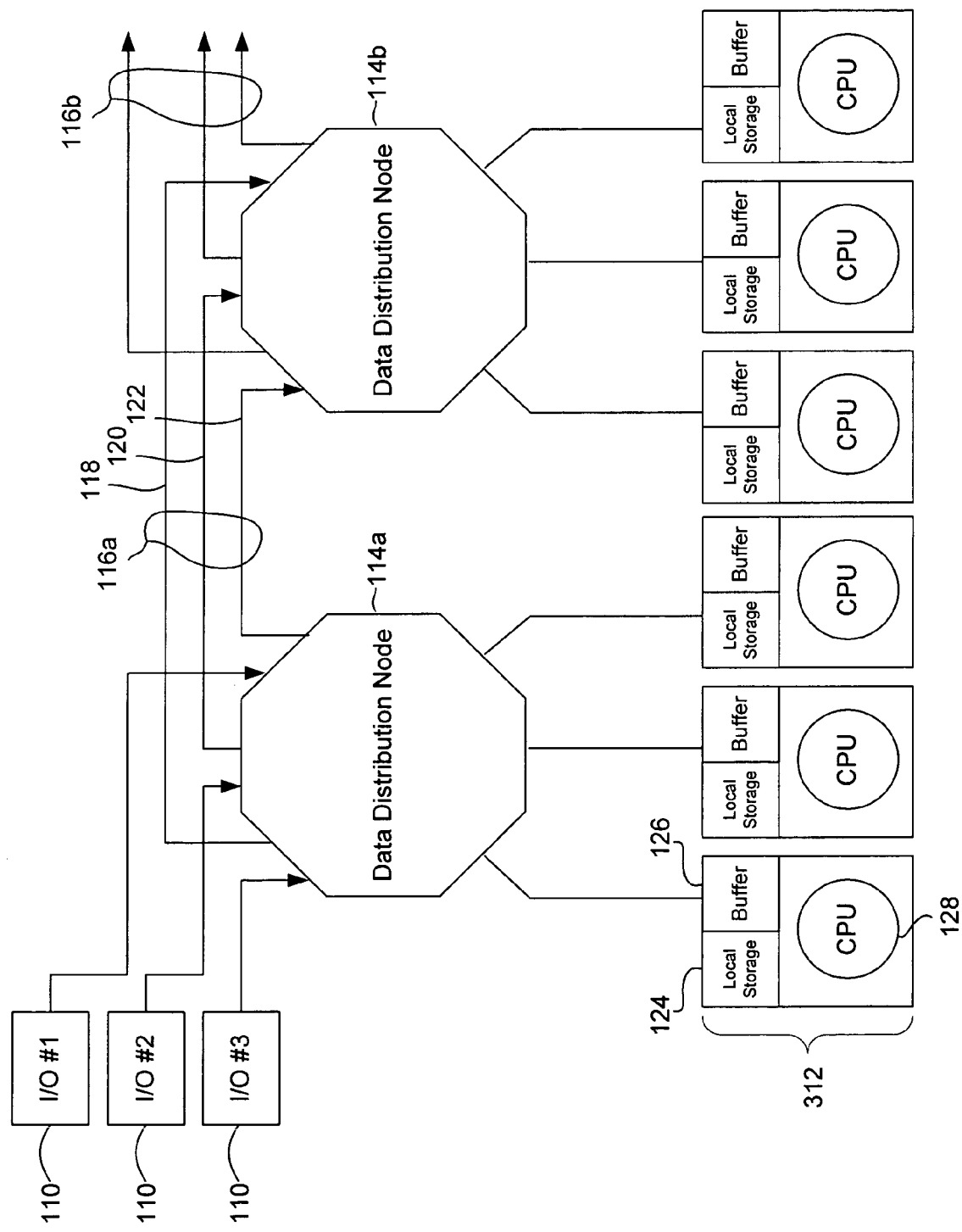
FIG. 5 illustrates an enlarged view of two data distribution nodes and the respective processing nodes to which the data distribution nodes are connected.

FIG. 5 illustrates an enlarged view of two data distribution nodes 114a and 114b and the respective processing nodes 312 to which the data distribution nodes are connected. Data distribution nodes 114a and 114b are connected to each other through a crossbar connection 116a, which actually is made up of three image transfer paths 118, 120, and 122. Data distribution node 114a receives input from three I/O channels 110 and crossbar connection 116a provides the link through which data distribution node 114b is able to obtain the data from channels 110. Each of the three image transfer paths 118, 120, and 122 transfers an image from one of I/O channels 110. Data distribution node 114b also has a crossbar connection 116b that connects data distribution node 114b to another data distribution node. Crossbar connections such as 116a and 116b allow each of data distribution nodes (e.g., 114a, 114b, etc.) to obtain data from everyone of I/O channels 110.

I/O channels 110 and crossbar connections 116 can be connected to data distribution nodes 114 in different combinations so long as each data distribution node 114 has access to data from each and every one of I/O channels 110. For instance, as shown in FIG. 5, all of I/O channels 110 can be connected to a single data distribution node 114a and then the other data distribution nodes (e.g., 114b and so on) receive data from I/O channels 110 through crossbar connections 116. Or, as shown in FIG. 4, I/O channels 110 can be connected to different data distribution nodes 114 such that each data distribution node 114 has access to data from each I/O channel 110 through crossbars 116.

Each of processing nodes 312 is shown to have a local data storage unit 124, a buffer 126, and a processing unit 128. The logical design of each processing node 312 is the same so that data distribution system 308 need not distinguish between each of processing nodes 312.

Figure 6:
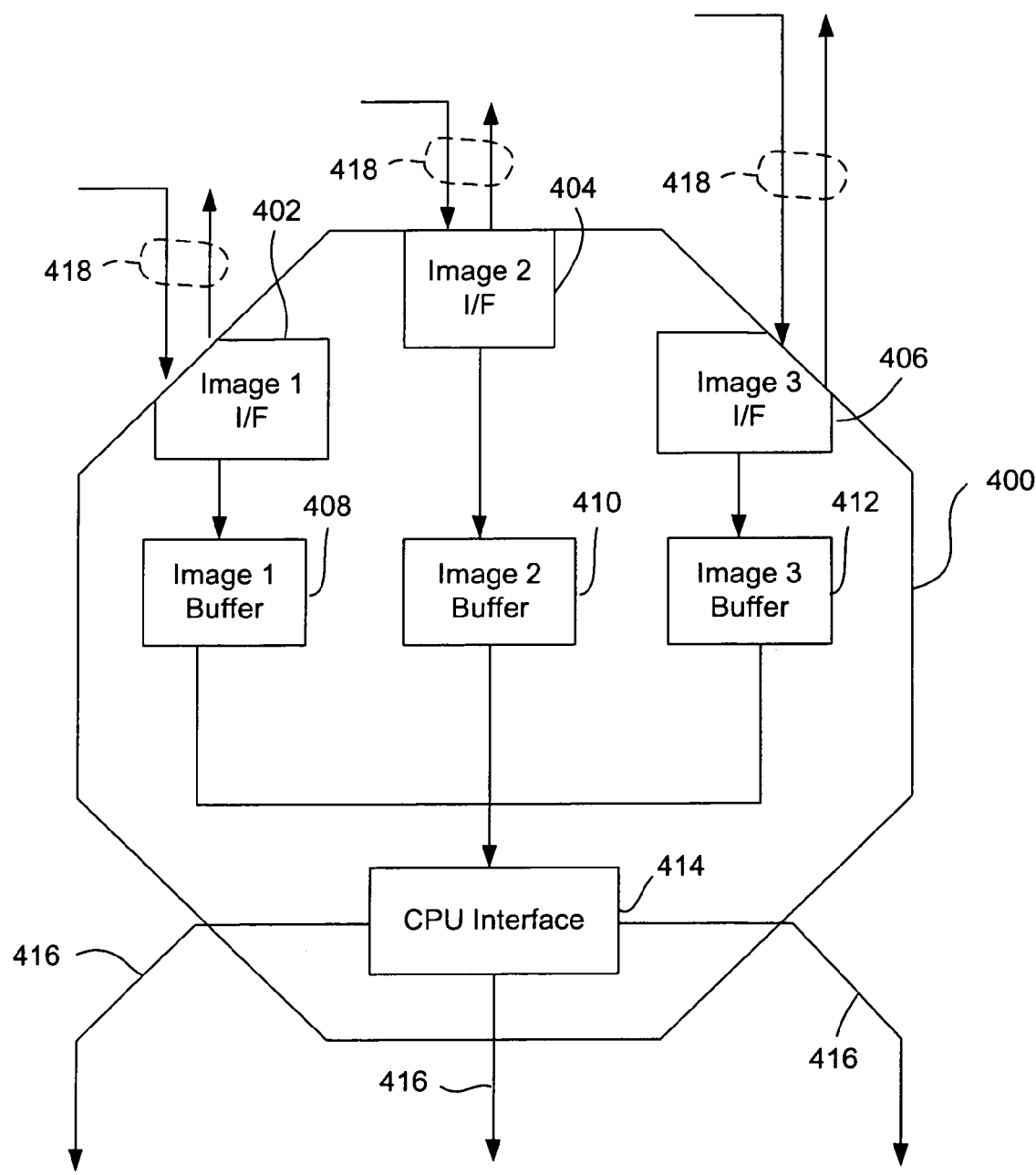
FIG. 6 illustrates a detailed view of a data distribution node according to one embodiment of the present invention.

FIG. 6 illustrates a detailed view of a data distribution node 400 according to one embodiment of the present invention. Data distribution node 400 includes I/O interface units 402, 404, and 406, data buffers 408, 410, and 412, and a CPU Interface (or a leaf cluster card) 414. I/O interface units 402, 404, and 406 manage receiving and transmitting image data from each of I/O channels 110 and across crossbar connections. I/O interface units 402, 404, and 406 respectively handle the data for an image collected from a first, second, and a third sensor. Buffers 408, 410, and 412 then store the image data until CPU interface 414 is ready to distribute the data to appropriate processing nodes through communication lines 416. CPU interface 414 is the interface between data distribution node 400 and the processing nodes. Image transfer paths 418 are connected to I/O channels and to other data distribution nodes within a data distribution system. Image transfer paths 418 can be implemented on, for example, a daisy chain network.

A job is described as a set of data and parameters needed to determine if a defect exists in a certain region of a semiconductor wafer. A job, in FIG. 5, can be made up of frames of data from three separate die where the data is collected by one sensor. In this case, a double-detection algorithm can be used to compare the frame from one die against the frames from the other two die. In another embodiment, a job can be made up of frames of data from four or more separate die where data is collected by one sensor. For example, such a job can contain a frame of data from each die within an entire row of device areas on a wafer. Such a job can also contain a frame of data from every device area on a wafer. Normally, when more frames of data are utilized, defect detection algorithms become more robust because more data is available to use in the defect detection algorithm.

Figure 7:
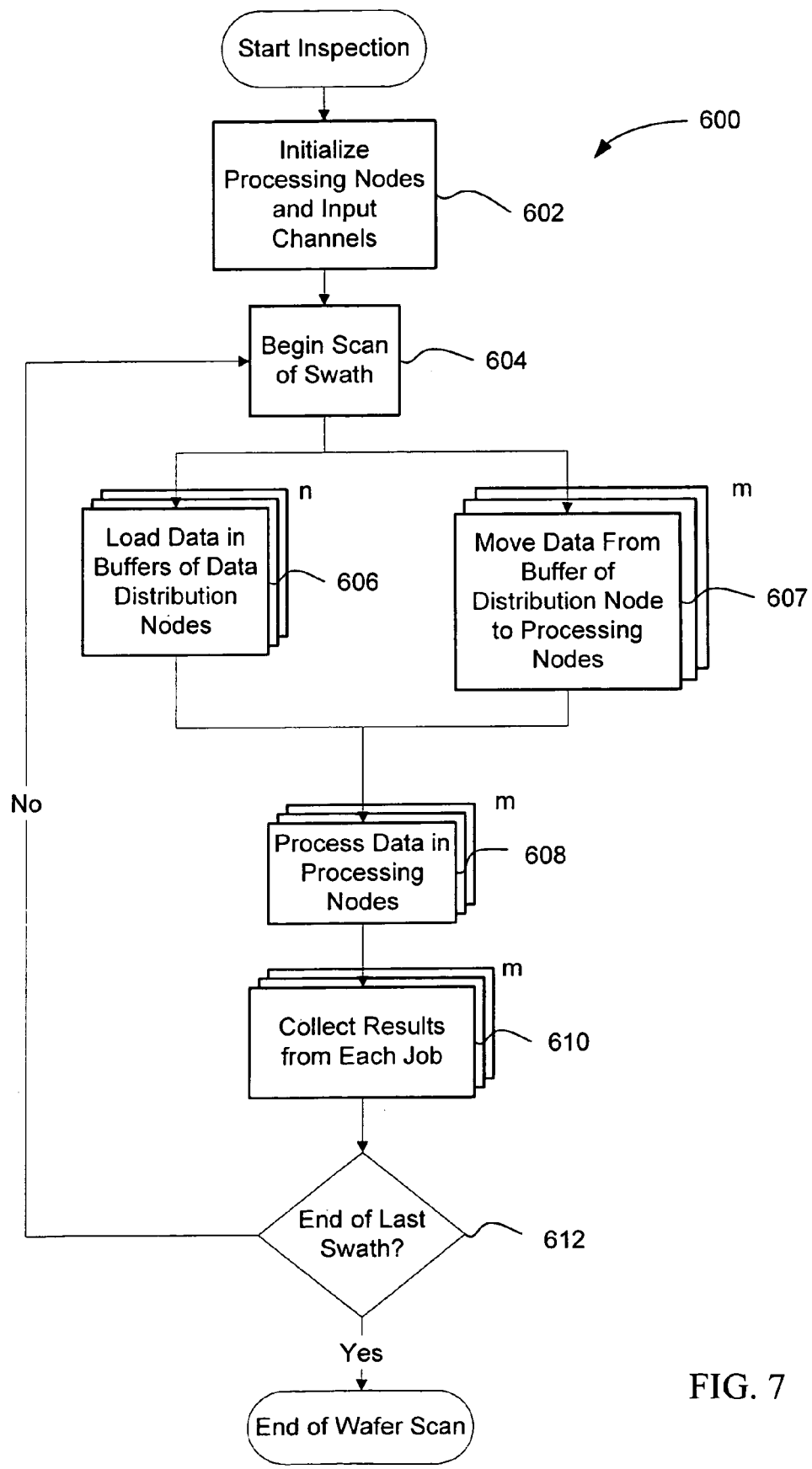
FIG. 7 illustrates a flow diagram that shows the basic process for inspecting a semiconductor wafer for defects according to one implementation of the present invention.

FIG. 7 illustrates a flow diagram 600 that shows the basic process for inspecting a semiconductor wafer for defects according to one implementation of the present invention. The inspection process begins at block 602 by initializing the processing nodes (or leaf processors) and I/O channels of the inspection system. This involves setting the various parameters required to inspect a certain semiconductor wafer. For example, parameters of the semiconductor wafer such as size of the wafer, size of the device areas, the types of integrated circuits within the wafer, the material of the wafer, and other factors are required. Parameters relating to the inspection system are also required. These parameters include for example, the number of processing nodes in the system, the size of the buffers in each of the processing nodes, the number of I/O channels, the bandwidth of each channel, which channels to use for each of the sensors/detectors in the system, and what algorithms to use in each of the processing nodes. Specific settings within each of the components of the system also need to be set. For example, the buffers in the processing nodes should be zeroed out before an inspection process begins.

Next, in block 604 the inspection system begins scanning a strip along a semiconductor wafer such that the one or more detectors placed over semiconductor wafer can collect data for processing. Block 606 shows that as the inspection system scans the wafer, the collected data from each sensor is stored in a respective image buffer 408, 410, or 412 located within one of the data distribution nodes 400. Reference made to FIG. 6. One buffer is allocated to store data collected by one of the sensors. Multiple copies of block 606 are shown because the operation of loading data into buffers is repeated for n number of sensors.

Block 607 is performed in parallel with block 606 to show that data from each of image buffers within data distribution nodes 400 is loaded into processing nodes for processing. m number of copies of block 607 is shown to be performed for each of m number of processing nodes. Data can be loaded into the buffer storage or the local storage of each processing node before processing by the CPU begins. The present invention allows data that is loaded into any of the data distribution nodes to be moved into any one of the processing nodes. Transferring image data between the various data distribution nodes through the crossbar connections facilitates this.

Preferably, data is distributed such that the processing nodes have equal processing loads. The buffer and strip memory in each processing node allow each processor to maintain a steady level of usage by providing a queue of data available for processing. In alternative embodiments, different data distribution schemes can be used to distribute data to each processing node in various manners.

At block 608, each processing node begins the processing of the received data. m copies of block 608 are shown to represent each of the m number of processing nodes that process data. In an alternative embodiment, blocks 606 and 607 can be designed to operate in series wherein block 606 then block 607 is performed.

In block 610, results from processing nodes are collected for each job of data. m number of copies of block 610 are shown since results are collected each of the m number of processing nodes. These results can then be used to provide information as to the defects present on a semiconductor wafer. When each node is finished processing data, a job manager is informed so that the job manager can direct the free node to begin processing the next job. The operations of process 600 are repeated until an end of a strip. The operations of process 600 can be repeated for a multiple number of strips on a wafer. At decision block 612, the inspection process 600 is determined to be complete after conducting the last scanning swath. In some embodiments, the operations of FIG. 7 are repeated until an entire wafer has been scanned.

Figure 8:
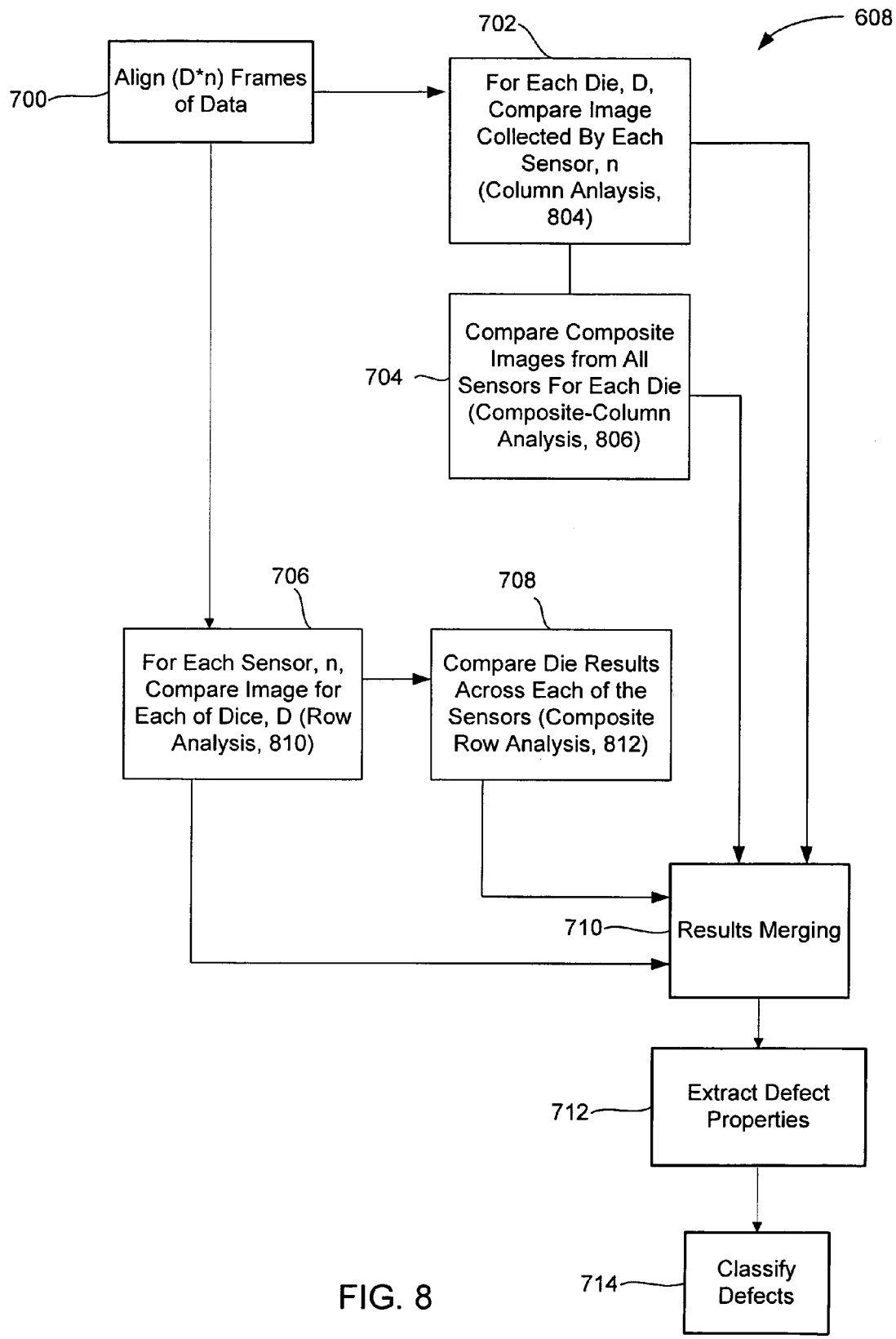
FIG. 8 illustrates the sub-operations of the data processing block from flow diagram according to one embodiment of the present invention.

FIG. 8 illustrates the sub-operations of the data processing block 608 from flow diagram 600 according to one embodiment of the present invention. FIG. 8 shows four techniques for analyzing data collected by the multiple sensors within an inspection system. These techniques are represented in blocks 702, 704, 706, and 708. The analysis results from one or more of the techniques can be used to obtain defect information. These results can be merged in block 710. Then in block 712, defect properties can be extracted from the merged results. Then in block 714, defects in semiconductor wafer can be classified. The analysis techniques of blocks 702, 704, 706, and 708 can be performed in series or in parallel with each other.

Before any analysis begins, the data processing of block 608 begins with sub-operation block 700 in which the frames of data that are to be used by the defect detection algorithms are aligned with each other. Aligning the frames facilitates the comparison of the data between the frames by allowing the defect detection process to more easily match pixels corresponding to the same regions within a wafer. It is noted here that analysis of the collected data is performed at a pixel-by-pixel level. In alternative embodiments, analysis can be performed by groupings of pixels to expedite the processing speed. D, represents the number of die being compared in the analysis techniques, and n represents the number of sensors used to collect data about the sample.

Figure 9:
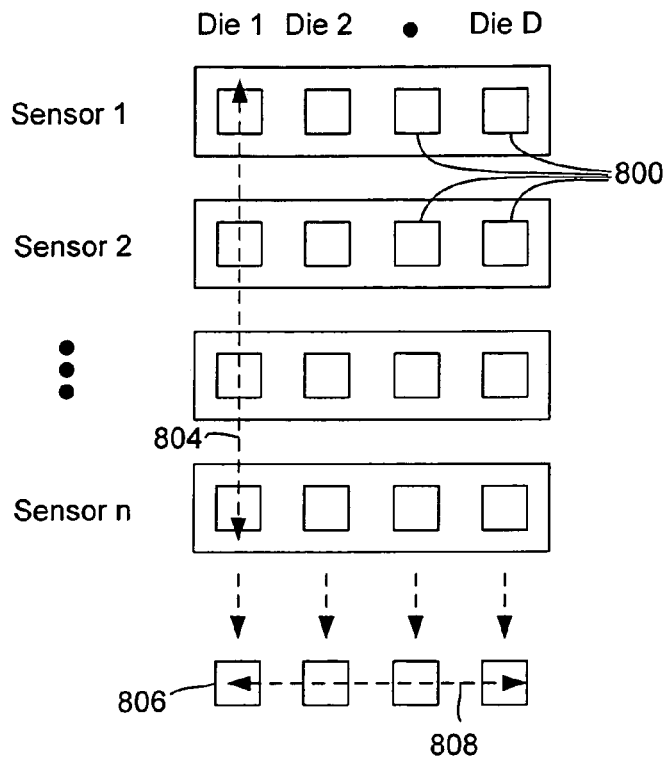
FIGS. 9 and 10 diagrammatically illustrate the sets of data collected by each of n number of sensors for D number of semiconductor die.
Figure 10:
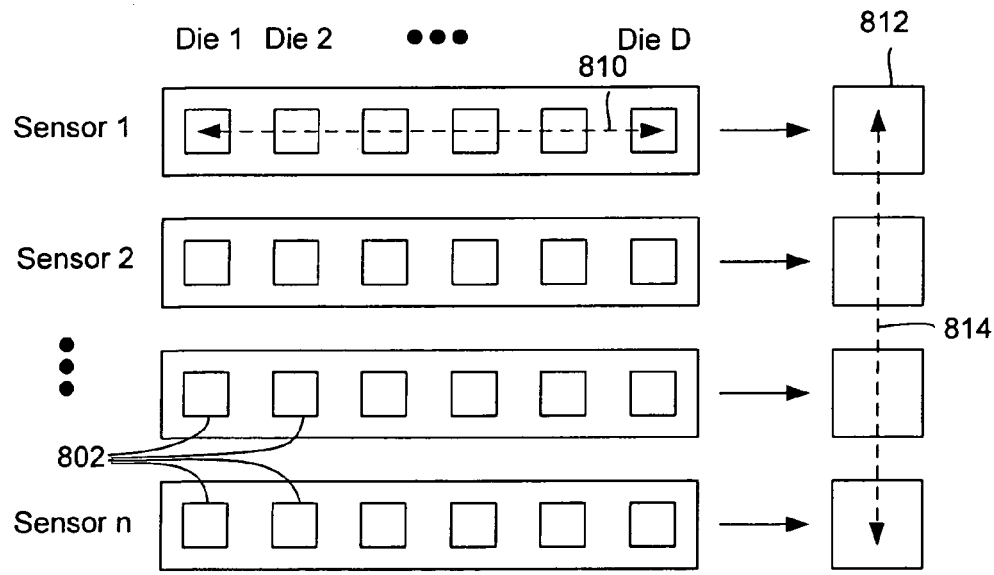

Before description of each analysis technique is given, it is first noted that analysis techniques 704 and 708 build upon the results of techniques 702 and 706, respectively. Also, description of each technique is facilitated with FIGS. 9 and 10. FIGS. 9 and 10 diagrammatically illustrate the sets of data collected by each of n number of sensors for D number of semiconductor die. FIG. 9 illustrates sets of data frames 800 collected by four sensors (n=4) for four die on a wafer (D=4, D being the number of die to be compared in analysis). Each data frame 800 represents data collected from one of the die. The data frames 800 can represent data collected from the entire die area or a portion of each die area. FIG. 10 illustrates sets of data frames 802 collected by four sensors (n=4) for six die of a wafer (D=6).

The first analysis technique of block 702 involves, for each die, D, comparing the data collected by each sensor, n. This technique is illustrated in FIG. 9 by directional arrow 804, which graphically represents the line of data frames 800 that are compared. The analysis technique of block 702 (and blocks 704, 706, and 708) can provide defect information for each die. However, more accurate information is obtained by combining the analysis results of block 702 with the analysis of the other three techniques to be explained. The technique of block 702 is referred to as "column" based analysis since comparison of data frames 800 are graphically represented in a column-like format.

The analysis technique of block 704 builds upon the analysis technique of block 702. Description of the technique of block 704 is described with reference to FIG. 9. In block 704, first, a combined image 806 for each die is generated by combining the images collected by each sensor corresponding to a specific die. Then, each of the combined images 806 for each of the die are compared against each other. This technique is illustrated by directional arrow 808, which graphically represents the set of combined images 806 that are compared against each other. The technique of block 704 is referred to as "composite-column" based analysis.

The analysis technique of block 706 is described with reference to FIG. 10. The analysis technique of block 706 involves, for each sensor, n, comparing the data frames 802 associated with each die, D. This technique is illustrated in FIG. 10 by directional arrow 810, which graphically represents the line of data frames 802 that are compared. The technique of block 706 is referred to as "row" based analysis since comparison of data frames 802 are graphically represented in a row-like format.

The analysis technique of block 708 builds upon the analysis technique of block 706. Description of the technique of block 708 is also described with reference to FIG. 10. In block 708, first, a composite image 812 of all of the die images collected by a single sensor is generated. A composite image 812 is generated for each of sensors, n. Then, each of combined images 812 for each sensor are compared against each other. This technique is illustrated by directional arrow 814, which graphically represents the set of combined images 812 that are compared against each other. The technique of block 708 is referred to as "composite-row" based analysis.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A computer-implemented method of detecting features on a semiconductor wafer comprising:
   collecting data with a plurality of detectors that are positioned about the semiconductor wafer, wherein at least one of the detectors is configured to collect data in a different manner from other detectors of the plurality of detectors and wherein each detector collects one data frame for each of a plurality of device areas;
   transmitting the data frames from each detector to a data distribution node, which is part of a set of data distribution nodes that are interconnected with crossbar connections that enable data collected by any of the plurality of detectors to be transferred to any of the data distribution nodes;
   transferring a first data frame along a first data transfer path that connects a first and a second data distribution node of the set of data distribution nodes;
   transferring a second data frame along a second data transfer path that connects the first and second data distribution nodes of the set of data distribution nodes;
   routing the data frames from the data distribution nodes to processing nodes, wherein the transferring of data frames between data distribution nodes allows data from any one of the detectors to be routed to any one of the processing nodes;
   aligning the data frames to facilitate pixel matching between the frames so that they correspond to the same regions of the wafer; and
   processing the aligned data frames using at least one of: row based analysis, composite-row based analysis, column based analysis, and composite column based analysis.

2. A computer-implemented method as recited in claim 1 wherein a number of data transfer paths equals the number of detectors that is used to collect data.

3. A computer-implemented method as recited in claim 1 further comprising:
   buffering data frames within data distributor buffers within each data distribution node.

4. A computer-implemented method as recited in claim 1 wherein each detector collects data for each of three or more device areas.

5. A computer-implemented method as recited in claim 1 wherein the processing of data further comprises a composite-column based analysis that involves,
   generating a second composite image for each device area by combining the data frames collected by each detector corresponding to a specific device area; and
   comparing each of the second composite images in order to obtain defect information.

6. A computer-implemented method as recited in claim 5 wherein the processing of data further comprises a row based analysis involving,
   for each detector, comparing the data frames collected for each of the plurality of device areas, wherein there are four or more device areas.

7. A computer-implemented method as recited in claim 6 wherein the processing of data further comprises a column based analysis involving,
   comparing the data frames collected by each detector for one of the device areas.

8. A computer-implemented method as recited in claim 5 wherein the processing of data further comprises a row based analysis involving,
   for each detector, comparing the data frames collected for each of the plurality of device areas, wherein there are four or more device areas.

9. A computer-implemented method as recited in claim 8 wherein the processing of data further comprises a column based analysis involving, comparing the data frames collected by each detector for one of the device areas.

10. A computer-implemented method as recited in claim 1 wherein processing the data frames comprises row based analysis within each of the processing nodes, each node processing a stream of the data frames received from a specified detector the frames comprising a row of data frames collected by the specified detector to generate a first composite row-based image and wherein each data frame in the row corresponds to a respective device area; and
    wherein each data frame in the row is compared to the first composite row-based image in order to identify defects in the device area.

11. A computer-implemented method as recited in claim 10 wherein processing the data frames further comprises composite row based analysis of the data frames generated by the plurality of sensors, wherein a node processes a stream of the data frames received from other detectors of the plurality of detectors wherein the frames comprise rows of data frames collected by other detectors of the plurality of detectors to generate corresponding composite row-based images wherein each of the data frames corresponds to a respective device area; and
    wherein each composite row-based image is compared with other composite row-based images in order to identify defects in the device area.

12. A computer-implemented method as recited in claim 1 wherein processing the data frames comprises column based analysis within each of the processing nodes, each node processing a plurality of the data frames received from a plurality of detectors, wherein each detector generates a stream of data frames with each data frame corresponding to a device area, wherein a first data fame of each stream of data frames is compared in order to identify defects in the device area.

13. A computer-implemented method as recited in claim 1 wherein each detector generates a stream of data frames with each data frame corresponding to a device area and wherein processing the data frames comprises composite column-based analysis within each of the processing nodes, each node combining a plurality of the data frames received from the plurality of detectors, wherein in a first processing node a first data frame of each stream of data frames is combined to form a first composite image and wherein a next of the plurality of processing nodes combines a plurality of next data frames of the stream of data frames received from the detectors to form a next composite image, and wherein the first composite image is compared with the next composite image in order to identify defects in the device.

14. A computer-implemented method as recited in claim 1 wherein processing the aligned data frames is conducted in parallel using a plurality of data processing nodes.

15. The computer-implemented method of claim 1, wherein collecting data with a plurality of detectors includes collecting the data using different types of detectors;

and wherein processing the aligned data frames includes processing the data frames collected by the different types of detectors together.

16. A semiconductor wafer inspection system as recited in claim 15 wherein each of the processing nodes are further configured to perform a composite-column based analysis that involves, generating a second composite image for each device area by combining a selected data frame from each stream of data frames collected by each detector corresponding to a specific device area; and comparing each of the second composite images in order to obtain defect information.

17. A semiconductor wafer inspection system comprising:
a semiconductor wafer having a plurality of device areas;
a plurality of detectors each configured to obtain data using more than one manner of data collection and wherein the detectors are positioned about a semiconductor wafer wherein each detector is configured to collect a data frame for each of the plurality of device areas;
a data distribution system that includes a plurality of data distribution nodes, at least one of the data distribution nodes configured to receive data frames from the detectors;
a plurality of data transfer paths connecting each of the data distribution nodes wherein at least some of the data transfer paths include crossbar connections between the data distribution nodes that enable data collected by any of the plurality of detectors to be transferred to any of the data distribution nodes and wherein each data transfer path transfers data frames collected by a respective detector;
a plurality of processing nodes configured to receive data frames from the data distribution system, the processing nodes configured to analyze the data frames, wherein the data transfer paths allow data frames collected by any one of the detectors to be routed to any one of the processing nodes; and
wherein each of the processing nodes are configured to align the data frames and conduct parallel processing of the data frames using at least one of: row based analysis, composite-row based analysis, column based analysis and composite column based analysis to identify defects.

18. A semiconductor wafer inspection system as recited in claim 17 wherein each data distribution node includes a data buffer for data frames collected by each of the detectors.

19. A semiconductor wafer inspection system as recited in claim 17 wherein each detector is configured to collect data from three or more device areas.

20. A semiconductor wafer inspection system as recited in claim 17 wherein the processing nodes perform a row based analysis that involves, generating a plurality of first row-based composite images, wherein each of the first row-based composite images are formed from a stream of data frames collected by one of the detectors, wherein each data frame corresponds to a respective device area; and comparing each of the data frames first row-based composite images in order to obtain defect information.

* * * * *